(12) United States Patent
Kim et al.

(10) Patent No.: US 9,659,852 B2
(45) Date of Patent: May 23, 2017

(54) SEMICONDUCTOR PACKAGE

(71) Applicant: Samsung Electronics Co., Ltd., Suwon-si, Gyeonggi-do (KR)

(72) Inventors: Tongsuk Kim, Hwaseong-si (KR); HyunJong Moon, Seoul (KR); Tai-Hyun Eum, Seoul (KR); Heeseok Lee, Suwon-si (KR); Keung Beum Kim, Hwaseong-si (KR); Yonghoon Kim, Suwon-si (KR); Yoonha Jung, Suwon-si (KR); Seung-Yong Cha, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/957,053

(22) Filed: Dec. 2, 2015

(65) Prior Publication Data
US 2016/0172291 A1 Jun. 16, 2016

(30) Foreign Application Priority Data

Dec. 12, 2014 (KR) ........................ 10-2014-0179298

(51) Int. Cl.
*H01L 23/52* (2006.01)
*H01L 23/498* (2006.01)
(Continued)

(52) U.S. Cl.
CPC ...... *H01L 23/49827* (2013.01); *H01L 21/486* (2013.01); *H01L 24/00* (2013.01);
(Continued)

(58) Field of Classification Search
CPC ............ H01L 23/49827; H01L 21/486; H01L 23/49811; H01L 22/34
(Continued)

(56) References Cited

U.S. PATENT DOCUMENTS 6,384,476 B2   5/2002  Takeuchi
6,611,419 B1 * 8/2003  Chakravorty ..... H01L 23/49822
                                                         257/E23.062
(Continued)

FOREIGN PATENT DOCUMENTS

JP          2005064027 A      3/2005
JP          2005064028 A      3/2005
(Continued)

*Primary Examiner* — Luan C Thai
(74) *Attorney, Agent, or Firm* — Harness, Dickey & Pierce, P.L.C.

(57) ABSTRACT

A semiconductor package may include a package substrate with a top surface and a bottom surface opposite to the top surface, the top surface of the package substrate configured to have a semiconductor chip mounted thereon, a power block and a ground block in the package substrate, the power block configured as a power pathway penetrating the package substrate, and the ground block configured as a ground pathway penetrating the package substrate, first vias extended from the power block and the ground block, and the first vias electrically connected to the semiconductor chip, second vias extended from the power block and the ground block toward the bottom surface of the package substrate, and block vias to penetrate the power block and the ground block, the block vias electrically connected to the semiconductor chip and electrically separated from the power block and the ground block.

19 Claims, 14 Drawing Sheets

(51) Int. Cl.
*H01L 21/48* (2006.01)
*H01L 23/00* (2006.01)

(52) U.S. Cl.
CPC ... *H01L 23/49811* (2013.01); *H01L 23/49894* (2013.01); *H01L 2924/0002* (2013.01)

(58) Field of Classification Search
USPC .......................................................... 257/774
See application file for complete search history.

(56) References Cited

U.S. PATENT DOCUMENTS

| | | | |
|---|---|---|---|
| 6,979,890 B2 * | 12/2005 | Kambe | H01L 23/49822 257/678 |
| 7,002,075 B2 * | 2/2006 | Kambe | H01L 23/498 174/260 |
| 7,391,110 B2 | 6/2008 | Cornelius | |
| 7,755,165 B2 | 7/2010 | Palanduz et al. | |
| 9,147,643 B2 * | 9/2015 | You | H01L 25/0655 |
| 2008/0067665 A1 | 3/2008 | Aziz et al. | |
| 2011/0048775 A1 | 3/2011 | Ishida et al. | |
| 2011/0073159 A1 | 3/2011 | Shen et al. | |

FOREIGN PATENT DOCUMENTS

| | | |
|---|---|---|
| JP | 4521223 B2 | 8/2010 |
| KR | 20000030091 A | 6/2000 |
| KR | 20000055589 A | 9/2000 |
| KR | 100608818 B1 | 8/2006 |

* cited by examiner

SEMICONDUCTOR PACKAGE

CROSS-REFERENCE TO RELATED APPLICATIONS

This U.S. non-provisional patent application claims priority under 35 U.S.C. §119 to Korean Patent Application No. 10-2014-0179298, filed on Dec. 12, 2014, in the Korean Intellectual Property Office, the entire contents of which are hereby incorporated by reference.

BACKGROUND

Example embodiments of the inventive concepts relate to a semiconductor package. For example, at least some example embodiments relate to a semiconductor package provided with a via hole.

As performance of electronic products is improved, heat produced in electronic devices may increase. To overcome the heating problem, a method of limiting performance of the electronic device is being used, when the electronic device reaches a set temperature. However, the method of limiting performance of the electronic device makes it difficult to improve efficiency of the electronic device because the more heat the electronic devices produce, the less the performance of the electronic devices. Alternatively, a method of operating a device with a reduced power or of embedding a metal block in the package is being developed to overcome the heating problem.

SUMMARY

Example embodiments of the inventive concepts provide a semiconductor package with improved electric characteristics.

Other example embodiments of the inventive concepts provide a semiconductor package with improved heat-dissipation characteristics.

According to example embodiments of the inventive concepts, a semiconductor package may include a package substrate with a top surface and a bottom surface opposite to the top surface the top surface of the package substrate configured to have a semiconductor chip mounted thereon, a power block and a ground block embedded in the package substrate, the power block configured as a power pathway penetrating the package substrate, and the ground block configured as a ground pathway penetrating the package substrate, first vias extended from the power block and the ground block, the first vias electrically connected to the semiconductor chip, second vias extended from the power block and the ground block toward the bottom surface of the package substrate, and block vias penetrating the power block and the ground block, the block vias electrically connected to the semiconductor chip and electrically separated from the power block and the ground block.

In example embodiments, the block vias may include a ground via penetrating the power block such that the ground via is electrically separated from the power block, and a power via penetrating the ground block such that the power via is electrically separated from the ground block. The ground via may be provided as a ground pathway penetrating the package substrate, and the power via may be provided as a power pathway penetrating the package substrate.

In example embodiments, the ground via may be provided in plural at a central region of the power block, and the power via may be provided in plural at a central region of the ground block.

In example embodiments, the semiconductor package may further include a first connection terminal on the bottom surface of the package substrate, the first connection terminal electrically connected to the power via, and a second connection terminal on the bottom surface of the package substrate, the second connection terminal electrically connected to the ground via.

In example embodiments, the first vias may include a first power via electrically connected to the power block, and a first ground via electrically connected to the ground block, and the second vias may include a second power via electrically connected to the power block, and a second ground via electrically connected to the ground block.

In example embodiments, the semiconductor package may further include a solder ball connecting the first via with the semiconductor chip. The solder ball may include a power solder ball connected to the first power via, and a ground solder ball connected to the first ground via.

In example embodiments, the semiconductor package may further include a first connection terminal on the bottom surface of the package substrate, the first connection terminal electrically connected to the first power via, a second connection terminal on the bottom surface of the package substrate, the second connection terminal electrically connected to the first ground via, a third connection terminal electrically connected to the second power via, and a fourth connection terminal electrically connected to the second ground via.

In example embodiments, the semiconductor package may further include an insulating layer provided between the power block and the ground block, the insulating layer extended along sidewalls of the power block and the ground block.

According to example embodiments of the inventive concepts, a semiconductor package may include a package substrate with a core part, a first plate, and a second plate, the first and second plates on a respective one of top and bottom surfaces of the core part, a semiconductor chip on a top surface of the package substrate, a power block and a ground block in the package substrate, the power block configured as a power pathway penetrating the package substrate, and the ground block configured as a ground pathway penetrating the package substrate, first vias electrically connecting the power block and the ground block to the semiconductor chip, second vias extended from the power block and the ground block toward a bottom surface of the package substrate, and metal vias connecting the first plates to the second plates, the metal vias in contact with at least one of the power and ground blocks.

In example embodiments, the first plate may include a first power plate on the top surface of the core part and adjacent to the power block, and a first ground plate on the top surface of the core part and adjacent to the ground block, and the second plate may include a second power plate on the bottom surface of the core part and adjacent to the power block, and a second ground plate on the bottom surface of the core part and adjacent to the ground block.

In example embodiments, the metal via may include a first metal via in contact with the power block, the first metal via electrically connecting the first power plate to the second power plate, and a second metal via in contact with the ground block, the second via electrically connecting the first ground plate to the second ground plate.

In example embodiments, the semiconductor package may further include a metal block in contact with a side surface of the power and ground blocks and connecting the first plate to the second plate.

In example embodiments, the metal block may include a first metal block electrically connected to the power block such that the first metal block electrically connects the first power plate to the second power plate, and a second metal block electrically connected to the ground block such that the second metal block electrically connects the first ground plate electrically to the second ground plate.

In example embodiments, the metal via may include a first metal via provided between the power block and the first metal block such that the first metal via electrically connects the first power plate to the second power plate, and a second metal via provided between the ground block and the second metal block to connect the first ground plate electrically to the second ground plate.

In example embodiments, the semiconductor package may further include a third via extended from the second power plate toward the bottom surface of the package substrate, and a fourth via extended from the second ground plate toward the bottom surface of the package substrate.

According to example embodiments of the inventive concepts, a package substrate configured to electrically connect to a semiconductor chip mounted on a first surface thereof, the package substrate may include connection terminals on a second surface of the package substrate, a power block configured to provide a plurality of the electrical paths between the connection terminals and the semiconductor chip, a ground block configured to provide a plurality of second electrical paths between the connection terminals and the semiconductor chip.

In example embodiments, the package substrate may further include a core part having a bottom surface and a top surface, the top surface and the bottom surface having a respective one of a first plate and a second plate thereon.

In example embodiments, the package substrate may further include block vias penetrating at least one of the power block and the ground block to electrically connect at least one of the connection terminals to the semiconductor chip while the block vias are electrically separate from the power block and the ground block, the block vias configured to provide at least one of a ground voltage and a source voltage to the semiconductor chip.

In example embodiments, the package substrate may further include an insulating layer extended along a sidewall of the power block and a sidewall of the ground block to electrically insulate the power block and the ground block.

In example embodiments, the power block is adjacent to the ground block with the insulating layer therebetween such that a mutual inductance exists between the power block and the ground block, and at least one of the power block and the ground block is configured to dissipate heat generated by the semiconductor chip.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
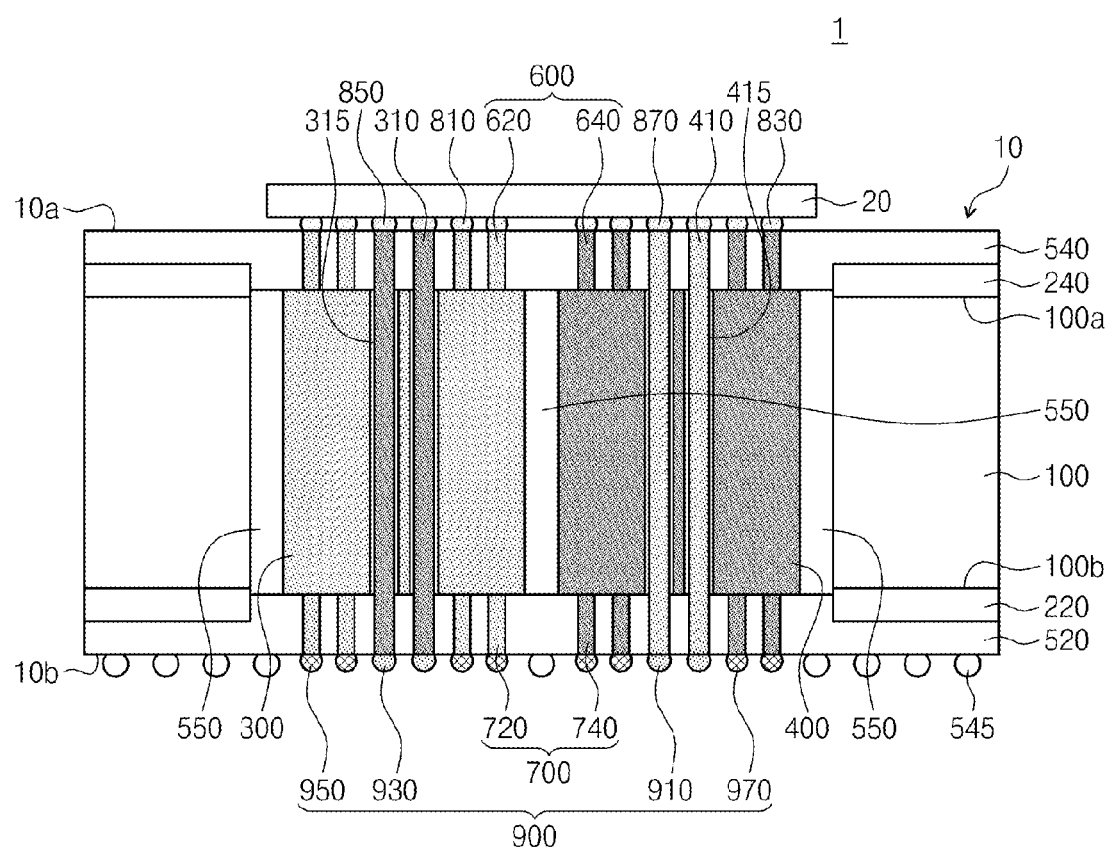
FIG. 1 is a sectional view illustrating a semiconductor package according to example embodiments of the inventive concepts.

It should be noted that these figures are intended to illustrate the general characteristics of methods, structures and/or materials utilized in certain example embodiments, and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which some example embodiments are shown. Example embodiments of the inventive concepts may, however, be embodied in many different forms and should not be construed as being limited to the example embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
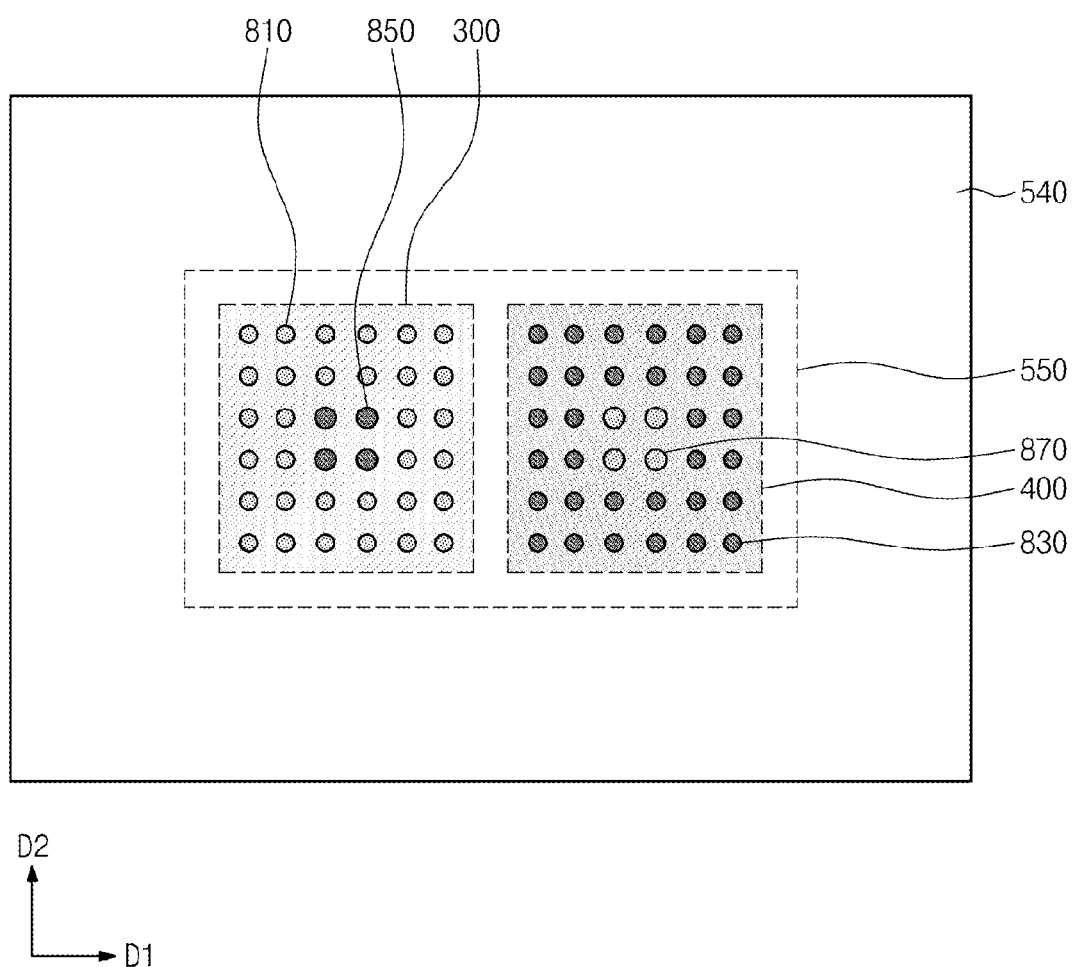
FIG. 2 is a plan view of a package substrate of FIG. 1.

FIG. 1 is a sectional view illustrating a semiconductor package according to example embodiments of the inventive concepts, and FIG. 2 is a plan view of a package substrate of FIG. 1.

Referring to FIGS. 1 and 2, a semiconductor chip 20 may be provided on a package substrate 10 to form a semiconductor package 1. The package substrate 10 may be for example, a printed circuit board, a flexible substrate, and/or a tape substrate. The package substrate 10 may include a core part 100 formed of an insulating material, a plurality of metal layers 220 and 240 provided in the form of a Copper Clad Laminate, and insulating layers 520 and 540 covering the metal layers 220 and 240. The insulating layers 520 and 540 may constitute a top surface 10a and a bottom surface 10b of the package substrate 10. An outer terminal 545 may be provided on the bottom surface 10b of the package substrate 10. The outer terminal 545 may electrically connect the semiconductor package 1 with a board of a mobile substrate and/or a memory module.

The core part 100 may include one of glass fiber, epoxy, and resin.

The plurality of metal layers 220 and 240 may be provided on a top surface 100a and a bottom surface 100b of the core part 100. The plurality of metal layers 220 and 240 may include an upper metal layer 240 provided on the top surface 100a of the core part 100 and a lower metal layer 220 provided on the bottom surface 100b of the core part 100.

A power block 300 and a ground block 400 may be provided in the package substrate 10. The power block 300 and the ground block 400 may be provided at the same level and spaced apart from each other. The power block 300 and the ground block 400 may be formed of or include, for example, at least one of copper (Cu), tungsten (W), or aluminum (Al). The power block 300 may be used as a path to deliver an electric power to semiconductor package 1, and the ground block 400 may be used as a path to deliver a ground signal to semiconductor package 1. The power block 300 and the ground block 400 may also be used as a path for exhausting heat generated in the package substrate 10 or the semiconductor chip 20.

The insulating layers 520 and 540 may include an upper insulating layer 540 covering top surfaces of the power block 300, the ground block 400, and the upper metal layer 240, and a lower insulating layer 520 covering bottom surfaces of the power block 300, the ground block 400 and the lower metal layer 220.

A vertical insulating layer 550 may be provided along sidewalls of the power block 300 and the ground block 400. The power block 300 and the ground block 400 may be spaced apart from each other by the vertical insulating layer 550. For example, the vertical insulating layer 550, the upper insulating layer 540, and the lower insulating layer 520 may include a resin coated copper (RCC) foil, FR-4, and/or an Ajinomoto build-up film (ABF). The vertical insulating layer 550, the upper insulating layer 540, and the lower insulating layer 520 may prevent an electric short circuit between the power block 300 and the ground block 400.

A plurality of first vias 600 may connect the power block 300 and ground block 400 to the semiconductor chip 20. The plurality of first vias 600 may be provided to penetrate the upper insulating layer 540. The plurality of first vias 600 may be formed of or include, for example, at least one of copper (Cu), tungsten (W), or aluminum (Al). The plurality of first vias 600 may include at least one first power via 620 electrically connecting the power block 300 to the semiconductor chip 20, and at least one first ground via 640 electrically connecting the ground block 400 with the semiconductor chip 20. Power solder balls 810 may be between the first power vias 620 and the semiconductor chip 20. The power solder balls 810 may be connected to the power block 300 to provide the electric power to the semiconductor chip 20. Ground solder balls 830 may be disposed between the first ground vias 640 and the semiconductor chip 20. The ground solder balls 830 may be connected to the ground block 400, thereby serving as a ground terminal.

A plurality of second vias 700 may be connected to each of the power block 300 and ground block 400. The plurality of second vias 700 may be provided to penetrate the lower insulating layer 520. The plurality of second vias 700 may be formed of or include, for example, at least one of copper (Cu), tungsten (W), or aluminum (Al). The plurality of second vias 700 may be exposed through the bottom surface 10b of the package substrate 10. The plurality of second vias 700 may include at least one second power via 720 electrically connected to the power block 300, and at least one second ground via 740 electrically connected to the ground block 400.

The package substrate 10 may include a plurality of block vias 310 and 410 provided to penetrate the power 300 and the ground blocks 400, respectively. The plurality of block vias 310 and 410 may include one or more ground vias 310 to penetrate the power block 300 and are electrically separated from the power block 300, and one or more power vias 410 to penetrate the ground block 400 and are electrically separated from the ground block 400. A ground via insulating layer 315 may be between the power block 300 and the ground via 310, thus, the ground via 310 may be electrically separated from the power block 300. Similarly, a power via insulating layer 415 may be between the ground block 400 and the power via 410, and thus the power via 410 may be electrically separated from the ground block 400. The power via 410 and the ground via 310 may be formed of or include, for example, at least one of copper (Cu), tungsten (W), or aluminum (Al). The power via 410 may penetrate a central region of the ground block 400 and may be exposed through the top surface 10a and bottom surface 10b of the package substrate 10, thereby serving as a path to deliver the electric power to semiconductor package 1. The ground via 310 may penetrate a central region of the power block 300 and may be exposed through the top surface 10a and bottom surface 10b of the package substrate 10, thereby serving as a path to deliver a ground voltage to semiconductor package 1.

A ground via solder ball 850 may be between the one or more ground via 310 and the semiconductor chip 20. The ground via solder ball 850 may connect the one or more ground vias 310 electrically with the semiconductor chip 20. A power via solder ball 870 may be between the one or more power vias 410 and the semiconductor chip 20. The power via solder ball 870 may electrically connect the one or more power vias 410 with the semiconductor chip 20.

For example, the power solder balls 810 and the ground via solder balls 850, electrically connected to the power block 300, may be arranged along first and second directions D1 and D2, respectively, orthogonal to each other to have a matrix or grid-shaped arrangement, as shown in FIG. 2. The ground via solder balls 850 may be arranged in the central region of the power block 300, and the power solder balls 810 may be arranged along an edge of the power block 300 to enclose the ground via solder balls 850.

The ground solder balls 830 and the power via solder balls 870, electrically connected to the ground block 400, may be arranged along the first and second directions D1 and D2 to have the matrix or grid-shaped arrangement, as shown in FIG. 2. The power via solder balls 870 may be arranged in the central region of the ground block 400, and the ground solder balls 830 may be arranged along an edge of the power via solder balls 870 to enclose the power via solder balls 870.

Connection terminals 900 may be provided on the bottom surface 10b of the package substrate 10. The connection terminals 900 may include a first connection terminal 910 electrically connected to the power via 410, a second connection terminal 930 electrically connected to the ground via 310, a third connection terminal 950 electrically connected to the second power via 720, and a fourth connection terminal 970 electrically connected to the second ground via 740. The first connection terminal 910 and the third connection terminal 950 may serve as a power terminal, and the second connection terminal 930 and the fourth connection terminal 970 may serve as the ground terminal.

The second connection terminal 930 and the third connection terminal 950, electrically connected to the power block 300, may be aligned with the ground via solder balls 850 and the power solder balls 810, respectively, when viewed in a plan view. The first connection terminal 910 and the fourth connection terminal 970, electrically connected to the ground block 400, may be aligned with the power via solder ball 870 and the ground solder balls 830, respectively, when viewed in a plan view. Accordingly, the connection terminals 900 may be arranged in the first and second directions D1 and D2, respectively, to have the matrix or grid-shaped arrangement, similar to the arrangement of the power via solder balls 870 and the ground solder balls 830 shown in FIG. 2.

Each of the power block 300 and the ground block 400 may be used as a heat-dissipation pathway and an electrical pathway for the semiconductor chip 20 and/or the package substrate 10, and the solder balls 810, 830, 850, and 870 and the connection terminals 910, 930, 950, and 970 may be used as a power-delivering pathway and a ground voltage pathway for the semiconductor chip 20 and/or the package substrate 10, thus makes it possible to effectively use a given area. In addition, since the power block 300 and the ground block 400 are adjacent to each other, it may be possible to reduce a distance between power and ground lines. Accordingly, the semiconductor package 1 can have an improved power property. For example, it may be possible to reduce a loop inductance between the power and ground lines, and consequently to improve electric characteristics of power and ground voltages. Further, since the ground via 310 penetrating the power block 300 and the power via 410 penetrating the ground block 400 may be provided, a mutual inductance between the power block 300 and the ground via 310, and between the ground block 400 and the power via 410 may be produced. Thus, as given by the following equation, a total mutual inductance may increase and a loop inductance may decrease, and thus the semiconductor package 1 can have an improved power property.

$$L_{loop} = L_{power} + L_{ground} - 2L_{mutual},$$ [Equation]

where $L_{loop}$ represents a total inductance, $L_{power}$ represents magnetic inductance of the power block (or power via), $L_{ground}$ represents magnetic inductance of the ground block (or ground via), and $L_{mutual}$ represents mutual inductance.

The semiconductor chip 20 may be mounted on the top surface 10a of the package substrate 10 in a flip-chip bonding manner. A bottom surface (e.g., an active surface) of the semiconductor chip 20 may be in contact with the solder balls 810, 830, 850, and 870. The semiconductor chip 20 may include, for example, a memory chip, a logic chip, or any combination thereof. In one or more example embodiments, a main heat-generation region of the semiconductor chip 20 may be a region, in which a central processing unit (CPU), a graphic processing unit (GPU), a memory interface, and/or a universal serial bus (USB) may be provided.

FIGS. 3A through 3G are sectional views illustrating a method of fabricating a semiconductor package according to example embodiments of the inventive concepts.

Figure 3A:
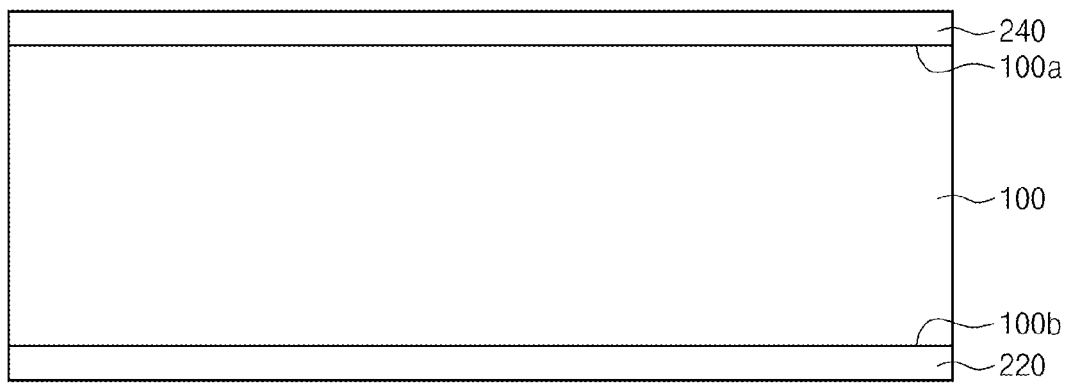
FIGS. 3A through 3G are sectional views illustrating a method of fabricating a semiconductor package according to example embodiments of the inventive concepts.

Referring to FIG. 3A, the upper metal layer 240 and the lower metal layer 220 may be formed on the top and bottom surfaces 100a and 100b, respectively, of the core part 100 of the package substrate 10 of the semiconductor package 1. The core part 100 may include one of glass fiber, epoxy, and resin. The metal layers 220 and 240 may be formed of or include, for example, at least one of copper (Cu), tungsten (W), or aluminum (Al).

Figure 3B:
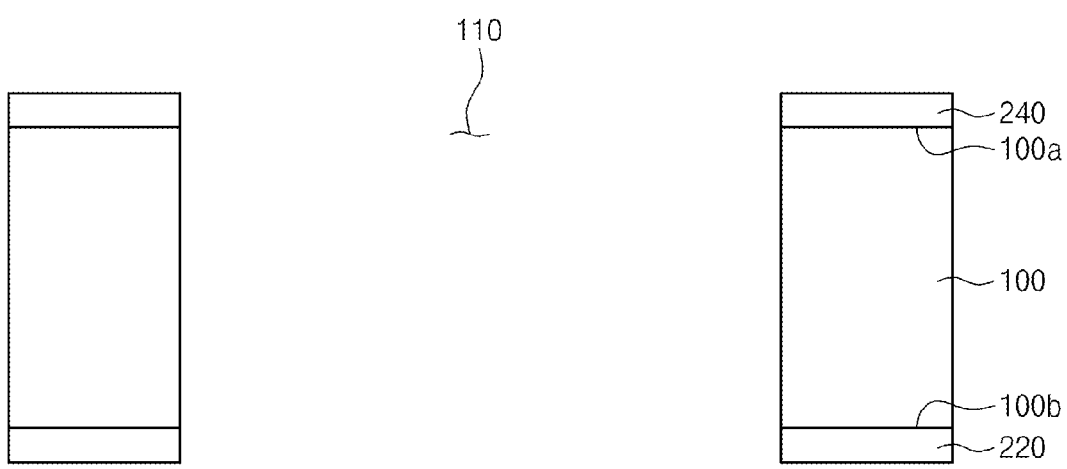

Referring to FIG. 3B, a cavity 110 may be formed to penetrate the core part 100 and the metal layers 220 and 240 of the package substrate 10 of the semiconductor package 1. The cavity 110 may be formed using a laser drilling process.

Figure 3C:
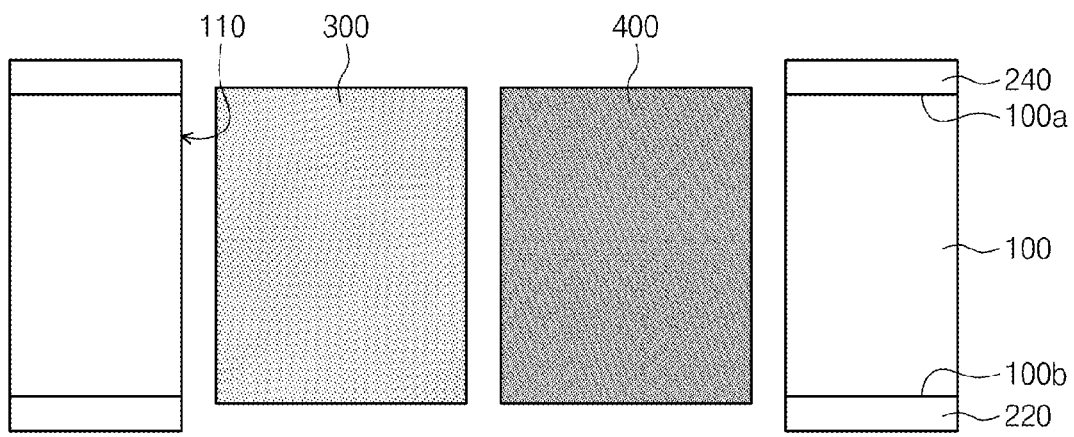

Referring to FIG. 3C, the power block 300 and the ground block 400 may be provided in the cavity 110. A supporter (not shown) in the form of an adhesive film, may be provided on a bottom surface of the lower metal layer 220. The supporter (not shown) may prevent the core part 100 and the metal layers 220 and 240 from being bent during a subsequent process. The power block 300 and the ground block 400 may be present side-by-side at the same level.

Figure 3D:
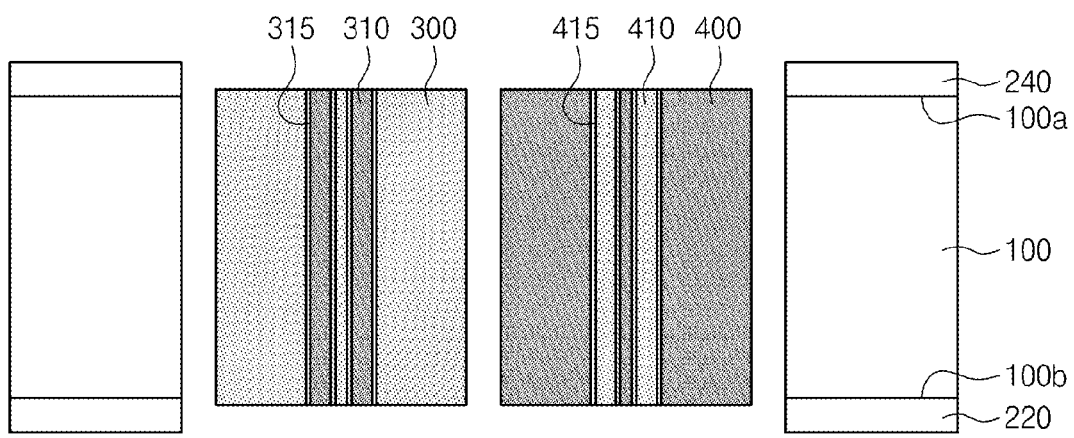

Referring to FIG. 3D, the ground via 310 and the power via 410 may be formed in the power block 300 and the ground block 400, respectively, in the cavity 110. The laser drilling process and a deposition process may be used to form the ground via 310 penetrating the power block 300 and the power via 410 penetrating the ground block 400. The ground via 310 and the power via 410 may be formed of or include, for example, at least one of copper (Cu), tungsten (W), or aluminum (Al). In some example embodiments, a plurality of ground vias 310 may be intensively provided through a central region of the power block 300. A plurality of power vias 410 may be intensively provided through a central region of the ground block 400. The ground via insulating layer 315 may be formed between the power block 300 and the ground via 310. The power via insulating layer 415 may be formed between the ground block 400 and the power via 410.

Figure 3E:
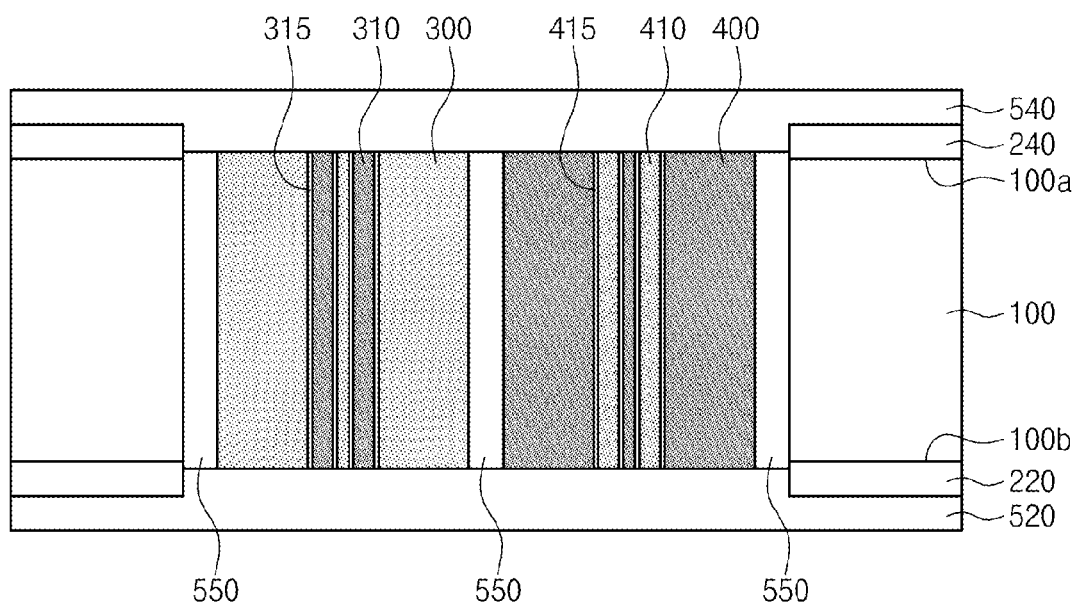

Referring to FIG. 3E, the vertical insulating layer 550 may be formed to cover side surfaces of the power block 300 and the ground block 400 of the package substrate 10 of the semiconductor package 1. The vertical insulating layer 550 may be at substantially the same level as those of the power block 300 and ground block 400. The upper insulating layer 540 and the lower insulating layer 520 may be formed to cover the plurality of metal layers 220 and 240, the power block 300 and the ground block 400.

Figure 3F:
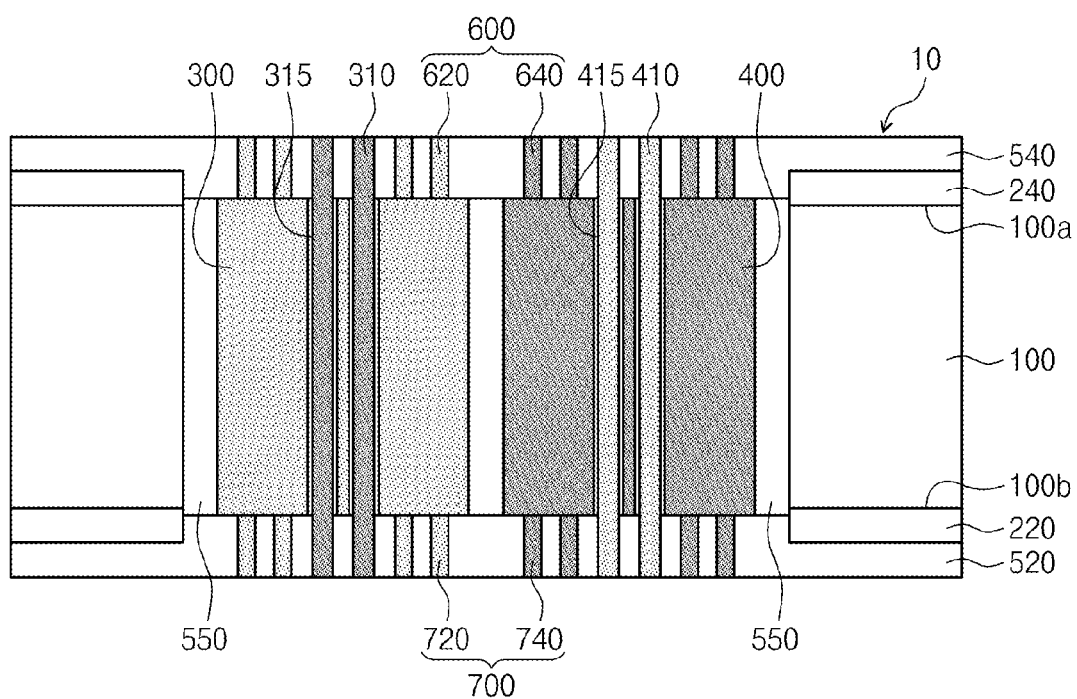

Referring to FIG. 3F, the plurality of first vias 600 and the second vias 700 may be formed in the upper insulating layer 540 and lower insulating layer 700, respectively, of the semiconductor package 1. The laser drilling process and the deposition process may be performed to form the plurality of first vias 600 penetrating the upper insulating layer 540 and the plurality of second vias 700 penetrating the lower insulating layer 520. The plurality of first vias 600 may be provided on the top surfaces of the power block 300 and the ground block 400. The plurality of first vias 600 may include at least one first power via 620 connected to the power block 300 and at least one first ground via 640 connected to the ground block 400.

The plurality of second vias 700 may be on the bottom surfaces of the power blocks 300 and the ground block 400. The plurality of second vias 700 may include at least one second power via 720 connected to the power block 300 and at least one second ground via 740 connected to the ground block 400.

The ground via 310 and the power via 410 may be extended to penetrate the upper insulating layer 540 and the lower insulating layer 520 of the semiconductor package 1. For example, the laser drilling process and the deposition process may be used to form extensions of the ground and power vias 310 and 410 penetrating the upper insulating layer 540 and the lower insulating layer 520.

As a result of the afore-described series of processes, the package substrate 10, in which the power block 300 pierced by the ground via 310 and the ground block 400 pierced by the power via 410 are embedded, may be manufactured.

Figure 3G:
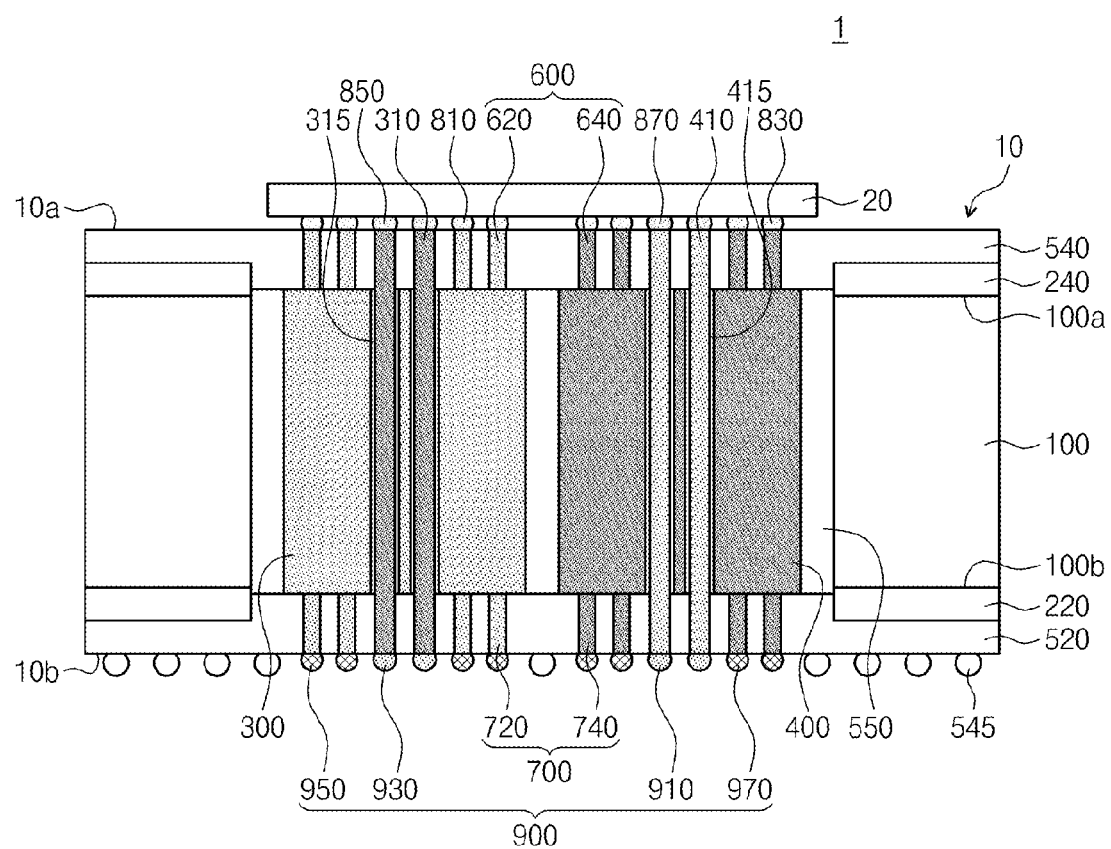

Referring to FIG. 3G, the semiconductor chip 20 may be mounted on the package substrate 10 of the semiconductor package 1. The solder balls 810, 830, 850, and 870 may be formed between the package substrate 10 and the semiconductor chip 20 to connect the package substrate 10 to the semiconductor chip 20. For example, the power solder balls 810 may be formed between the plurality of first power vias 620 and the semiconductor chip 20. The power solder balls 810 may be connected to the power block 300 and the first power vias 620, and may be used to deliver the electric power to the semiconductor chip 20. The ground solder balls 830 may be formed between the plurality of first ground vias 640 and the semiconductor chip 20. The ground solder balls 830 may be connected to the ground block 400 and the first ground vias 640, thereby serving as the ground terminal.

The ground via solder ball 850 may be formed between the ground via 310 and the semiconductor chip 20. The power via solder ball 870 may be formed between the power via 410 and the semiconductor chip 20.

The outer terminal 545 and the connection terminals 900 may be formed on the bottom surface 10b of the package substrate 10. The connection terminals 900 may include the first connection terminal 910, the second connection terminal 930, the third connection terminal 950, and the fourth connection terminal 970. The first connection terminal 910 may be electrically connected to the power via 410. The second connection terminal 930 may be electrically connected to the ground via 310. The third connection terminal 950 may be electrically connected to the second power via 720. The fourth connection terminal 970 may be electrically connected to the second ground via 740. The first connection terminal 910 and the third connection terminal 950 may serve as the power terminal, and the second connection terminal 930 and the fourth connection terminal 970 may serve as the ground terminal.

Figure 4:
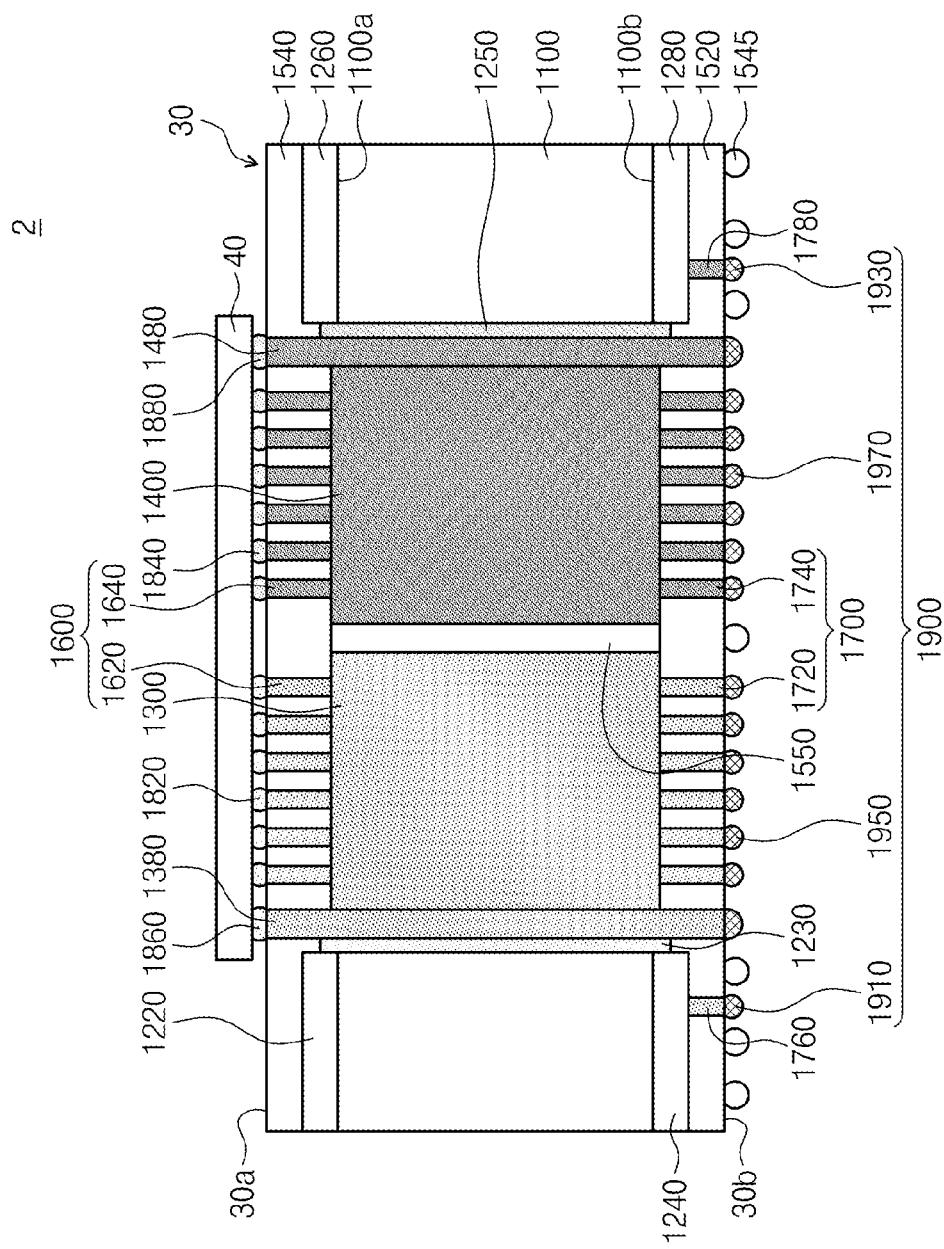
FIG. 4 is a sectional view illustrating a semiconductor package according to other example embodiments of the inventive concepts.
Figure 5:
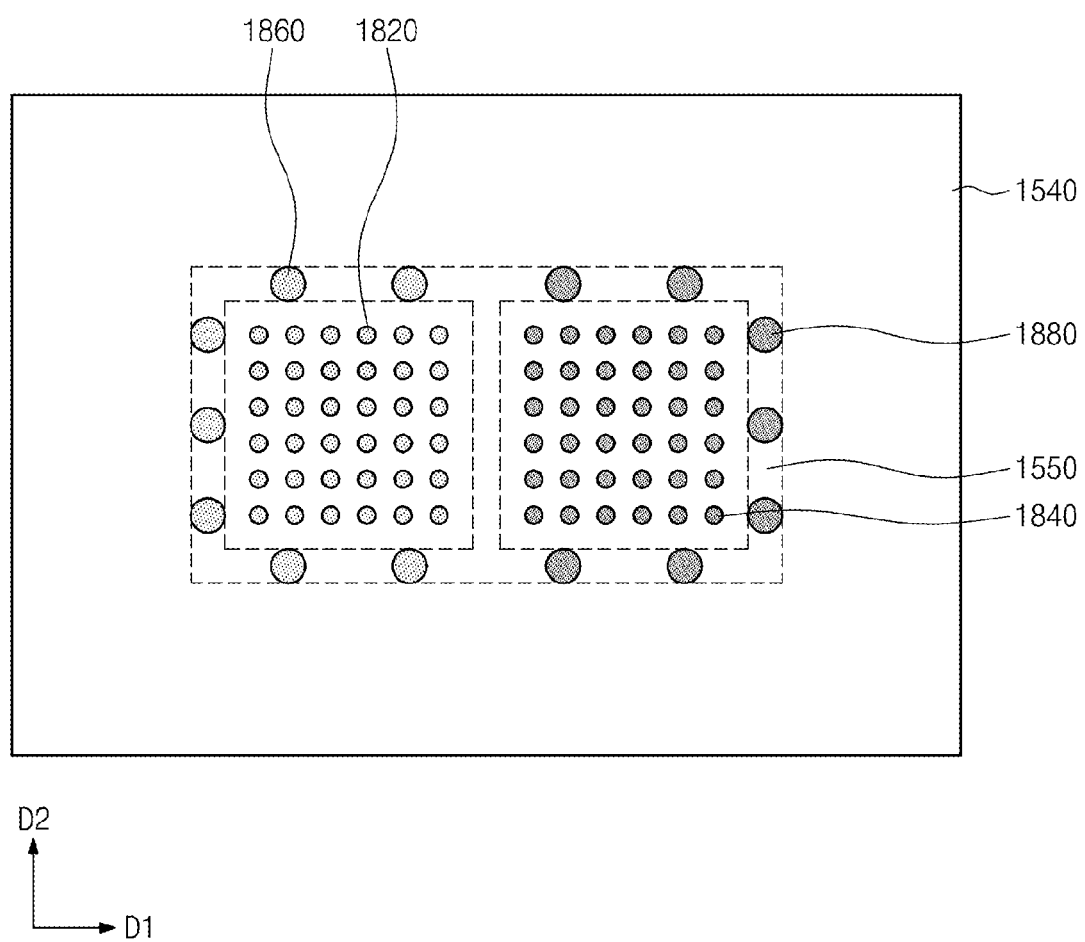
FIG. 5 is a plan view of a package substrate of FIG. 4.

FIG. 4 is a sectional view illustrating a semiconductor package according to other example embodiments of the inventive concepts, and FIG. 5 is a plan view of a package substrate of FIG. 4.

Referring to FIGS. 4 and 5, a semiconductor chip 40 may be provided on a package substrate 30 to form a semiconductor package 2. The package substrate 30 may be for example, a printed circuit board, a flexible substrate, and/or a tape substrate. The package substrate 30 may include a core part 1100, a plurality of plates 1220, 1240, 1260, and 1280, and a plurality of insulating layers 1520 and 1540. The plurality of insulating layers 1520 and 1540 may constitute a top surface 30a and a bottom surface 30b of the package substrate 30. An outer terminal 1545 may be provided on the bottom surface 30b of the package substrate 30. The outer terminal 1545 may electrically connect the semiconductor package 2 with a board of a mobile substrate and/or a memory module.

The core part 1100 may include one of glass fiber, epoxy, and resin.

A power block 1300 and a ground block 1400 may be provided in the package substrate 30. The power block 1300 and the ground block 1400 may be provided at a same level as the core part 1100 and spaced apart from each other. The power block 1300 and the ground block 1400 may be formed of or include, for example, at least one of copper (Cu), tungsten (W), or aluminum (Al). The power block 1300 may be used as a path to deliver an electric power to semiconductor package 2, and the ground block 1400 may be used as a path to deliver a ground voltage to semiconductor package 2. The power block 1300 and the ground block 1400 may also be used as a path for exhausting heat generated in the semiconductor chip 40 or in the package substrate 30.

The first plates 1220 and 1260 may be on a top surface 1100a of the core part 1100, and the second plates 1240 and 1280 may be provided on a bottom surface 1100b of the core part 1100. The first plates 1220 and 1260 may include a first power plate 1220 adjacent to the power block 13000 and a first ground plate 1260 adjacent to the ground block 1400. The second plates 1240 and 1280 may include a second power plate 1240 adjacent to the power block 1300 and a second ground plate 1280 adjacent to the ground block 1400. A third via 1760 may be provided on a bottom surface of the second power plate 1240 and may be extended toward the bottom surface 30b of the package substrate 30. A fourth via 1780 may be provided on a bottom surface of the second ground plate 1280 and may be extended toward the bottom surface 30b of the package substrate 30. The third via 1760 and the fourth via 1780 may be formed of or include, for example, at least one of copper (Cu), tungsten (W), or aluminum (Al). The third via 1760 may be used as a power-delivering pathway, and the fourth via 1780 may be used as a ground voltage pathway for the semiconductor chip 40 and/or the package substrate 30.

Metal blocks 1230 and 1250 may be provided on a side surface of the core part 1100 of the package substrate 30. The metal blocks 1230 and 1250 may be formed of or include, for example, at least one of copper (Cu), tungsten (W), or aluminum (Al). The metal blocks 1230 and 1250 may include a first metal block 1230 electrically connected to the power block 1300, and a second metal block 1250 electrically connected to the ground block 1400. The first metal block 1230 may connect the first power plate 1220 to the second power plate 1240 provided on the top surface 1100a and the bottom surface 1100b of the core part 1100 of the package substrate 30, respectively. The first metal block 1230 may serve as the power-delivering pathway and a heat-dissipation pathway for the semiconductor chip 40 and/or the package substrate 30. The second metal block 1250 may connect the first ground plate 1260 to the second ground plate 1280. The second metal block 1250 may serve as the ground voltage pathway and the heat-dissipation pathway for the semiconductor chip 40 and/or the package substrate 30.

An upper insulating layer 1540 of the package substrate 30 may cover top surfaces of the power block 1300, the ground block 1400, and the first plates 1220 and 1260, and a lower insulating layers 1520 of the package substrate 30 may cover bottom surfaces of the power block 1300, the ground block 1400, and the second plates 1240 and 1280. A vertical insulating layer 1550 may be between the power block 1300 and the ground block 1400. For example, the vertical insulating layer 1550, the upper insulating layer 1540, and the lower insulating layer 1520 of the package substrate 30 may include a resin coated copper (RCC) foil, FR-4, and/or an Ajinomoto build-up film (ABF).

A plurality of first vias 1600 may be connected to each of the power block 1300 and the ground block 1400 to the semiconductor chip 40. The plurality of first vias 1600 may penetrate the upper insulating layer 1540 of the package substrate 30. The plurality of first vias 1600 may be formed of or include, for example, at least one of copper (Cu), tungsten (W), or aluminum (Al). The plurality of first vias 1600 may include at least one first power via 1620 electrically connecting the power block 1300 with the semiconductor chip 40, and at least one first ground via 1640 electrically connecting the ground block 1400 with the semiconductor chip 40.

A plurality of second vias 1700 may be connected to each of the power block 1300 and the ground block 1400. The plurality of second vias 1700 may penetrate the lower insulating layer 1520 of the package substrate 30. The plurality of second vias 1700 may be formed of or include, for example, at least one of copper (Cu), tungsten (W), or aluminum (Al). The plurality of second vias 1700 may be exposed through the bottom surface 30b of the package substrate 30. The plurality of second vias 1700 may include at least one second power via 1720 electrically connected to the power block 1300, and at least one second ground via 1740 electrically connected to the ground block 1400.

Metal vias 1380 and 1480 may connect the first plates 1220 and 1260 to the second plates 1240 and 1280. The metal vias 1380 and 1480 may be formed of or include, for example, at least one of copper (Cu), tungsten (W), or aluminum (Al). The metal vias 1380 and 1480 may include a first metal via 1380 in contact with the power block 1300, and a second metal via 1480 in contact with the ground block 1400. The first metal via 1380 may be provided between the first metal block 1230 and the power block 1300 to electrically connect the first power plate 1220 to the second power plate 1240. The first metal via 1380 may be provided to be in contact with a side surface of the power block 1300. The first metal via 1380 may serve as the power-delivering pathway for the semiconductor chip 40 and/or the package substrate 30. The second metal via 1480 may be provided between the second metal block 1250 and the ground block 1400 to electrically connect the first ground plate 1260 to the second ground plate 1280. The second metal via 1480 may be in contact with a side surface of the ground block 1400. The second metal via 1480 may serve as the ground voltage pathway for the semiconductor chip 40 and/or the package substrate 30. The metal vias 1380 and 1480 may in contact with the power block 1300 and the ground block 1400, thereby serving as the heat-dissipation pathway for the semiconductor chip 40 and/or the package substrate 30.

Solder balls 1820, 1840, 1860, and 1880 may be provided between the package substrate 30 and the semiconductor chip 40 of the semiconductor package 2. The power solder balls 1820 may be in contact with the first power vias 1620 and the semiconductor chip 40. The power solder balls 1820 may be connected to the power block 1300 and the first power vias 1620 to supply the electric power to the semiconductor chip 40. The ground solder balls 1840 may be in contact with the first ground vias 1640 and the semiconductor chip 40. The ground solder balls 1840 may be connected to the ground block 1400 and the first ground vias 1640 to serve as a ground terminal. The metal solder balls 1860 and 1880 may be in contact with the metal vias 1380 and 1480 and the semiconductor chip 40. The metal solder ball 1860 adjacent to the power block 1300 may be connected to the first metal via 1380 to supply the electric power to the semiconductor chip 40. The metal solder ball 1880 adjacent to the ground block 1400 may be connected to the second metal via 1480 to serve as the ground terminal.

The power solder balls 1820 may be electrically connected to the power block 1300 and the ground solder balls 1840 may be electrically connected to the ground block 1400. The power solder balls 1820 and the ground solder balls 1840 may be arranged along the first and second directions D1 and D2, respectively, to have a matrix- or grid-shaped arrangement, as shown in FIG. 5. The metal solder balls 1860 and 1880 may be provided at an edge of the power block 1300 and the ground block 1400, respectively.

Connection terminals 1900 may be provided on the bottom surface 30b of the package substrate 30. The connection terminals 1900 may include a first connection terminal 1910 electrically connected to the third via 1760, a second connection terminal 1930 electrically connected to the fourth via 1780, a third connection terminal 1950 electrically connected to the second power via 1720 and the first metal via 1380, and a fourth connection terminal 1970 electrically connected to the second ground via 1740 and the second metal via 1480. The first connection terminal 1910 and the third connection terminal 1950 may serve as a power terminal, and the second connection terminal 1930 and the fourth connection terminal 1970 may serve as a ground terminal.

The third connection terminal 1950 electrically connected to the power block 1300 may be aligned with the power solder balls 1820, respectively, when viewed in a plan view. The fourth connection terminal 1970 electrically connected to the ground block 1400 may be aligned with the ground solder balls 1840, respectively, when viewed in a plan view. Accordingly, the connection terminals 1900 may be arranged in the first and second directions D1 and D2, respectively, to have the matrix- or grid-shaped arrangement, similar to the arrangement of the power solder balls 1820 and the ground solder balls 1840 shown in FIG. 5.

The power block 1300 and the ground block 1400 may be used as the heat-dissipation pathway and an electrical pathway for the semiconductor chip 40 and/or the package substrate 30, and the solder balls 1820, 1840, 1860, and 1880 and the connection terminals 1910, 1930, 1950, and 1970 in contact with the power block 1300 and the ground block 1400 may be used as the power-delivering pathway and the ground voltage pathway for the semiconductor chip 40 and/or the package substrate 30, and thus makes it possible to effectively use a given area. In addition, since the power block 1300 and ground block 1400 are adjacent to each other, it may be possible to reduce a distance between power and ground lines. The metal vias 1380 and 1480 may make it possible to reduce a magnetic inductance L. If a uniform voltage is applied, decreasing current may lead to an increase of magnetic inductance (L). If a uniform voltage is applied, increasing resistance may lead to a reduction of current. According to example embodiments of the inventive concepts, the metal vias 1380 and 1480 may be provided to be in contact with the power block 1300 and the ground block 1400, respectively, and thus makes it possible to increase effective sectional areas of the metal vias 1380 and 1480, and consequently to decrease electric resistances of the metal vias 1380 and 1480. Accordingly, the semiconductor package 2 can have an improved power property.

The semiconductor chip 40 in semiconductor package 2 may be mounted on the top surface 30a of the package substrate 30 in a flip-chip bonding manner. The plurality of solder balls 1820 and 1840 may be provided to be in contact with a bottom surface (e.g., an active surface) of the semiconductor chip 40. The semiconductor chip 40 may include, for example, a memory chip, a logic chip, or any combination thereof. In one or more example embodiments, a main heat-generation region of the semiconductor chip 40 may be a region, in which a central processing unit (CPU), a graphic processing unit (GPU), a memory interface, or a universal serial bus (USB) may be provided.

FIGS. 6A through 6H are sectional views illustrating a method of fabricating a semiconductor package according to other example embodiments of the inventive concepts.

Figure 6A:
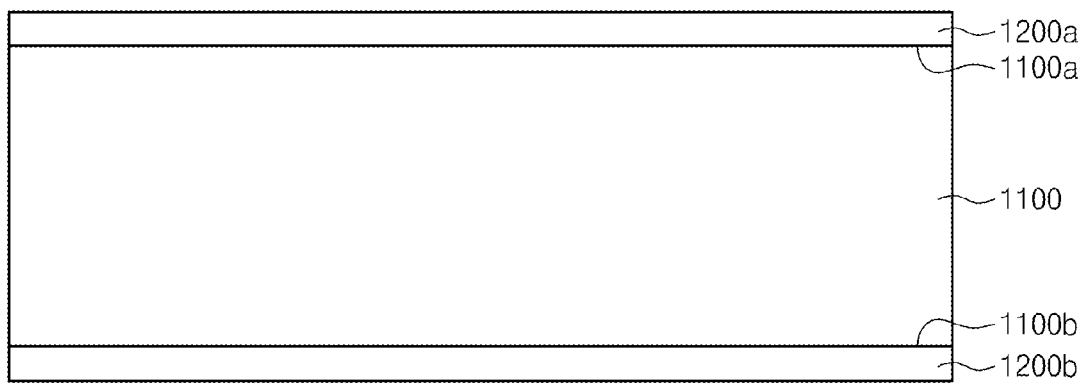
FIGS. 6A through 6H are sectional views illustrating a method of fabricating a semiconductor package according to other example embodiments of the inventive concepts.

Referring to FIG. 6A, a first plate 1200a may be formed on the top surface 1100a of the core part 1100, and a second plate 1200b may be formed on the bottom surface 1100b of the core part 1100 of the package substrate 30 of the semiconductor package 2. The core part 1100 may include one of glass fiber, epoxy, and resin. The first plate 1200a and the second plate 1200b may be formed of or include, for example, at least one of copper (Cu), tungsten (W), and/or aluminum (Al).

Figure 6B:
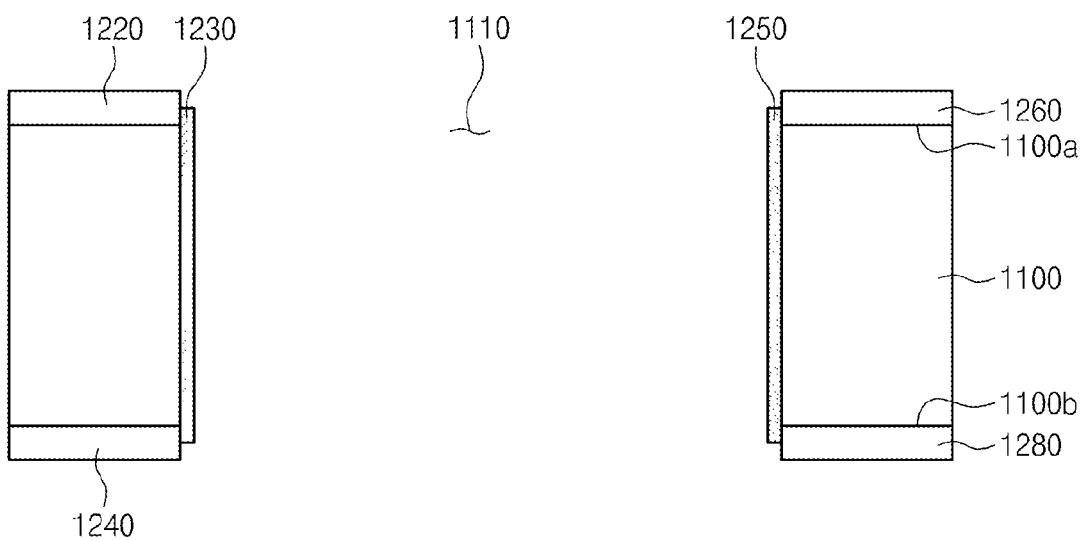

Referring to FIG. 6B, a cavity 1110 may be formed to penetrate the core part 1100, the first plate 1200a, and the second plate 1200b of the package substrate 30 of semiconductor package 2. The cavity 1110 may be formed using a laser drilling process. The first plates 1220 and 1260 and the second plates 1240 and 1280 may be formed as a result of the formation of the cavity 1110. The metal blocks 1230 and 1250 may be formed on side surfaces of the core part 1100. The metal blocks 1230 and 1250 may be formed using a metal-plating process. In other words, the metal blocks 1230 and 1250 may include a metal layer formed by an electroplating technique. The metal blocks 1230 and 1250 may include the first metal block 1230 electrically connecting the first power plate 1220 with the second power plate 1240, and the second metal block 1250 electrically connecting the first ground plate 1260 with the second ground plate 1280.

Figure 6C:
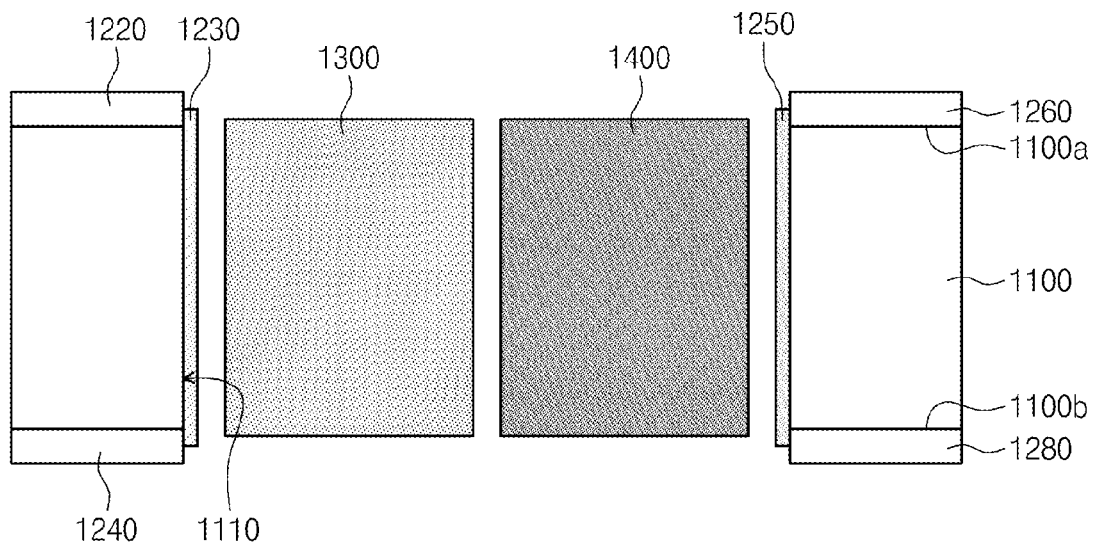

Referring to FIG. 6C, the power block 1300 and the ground block 1400 may be in the cavity 1110 of the package substrate 30 of semiconductor package 2. The power block 1300 and the ground block 1400 may be provided at the same level and spaced apart from each other.

Figure 6D:
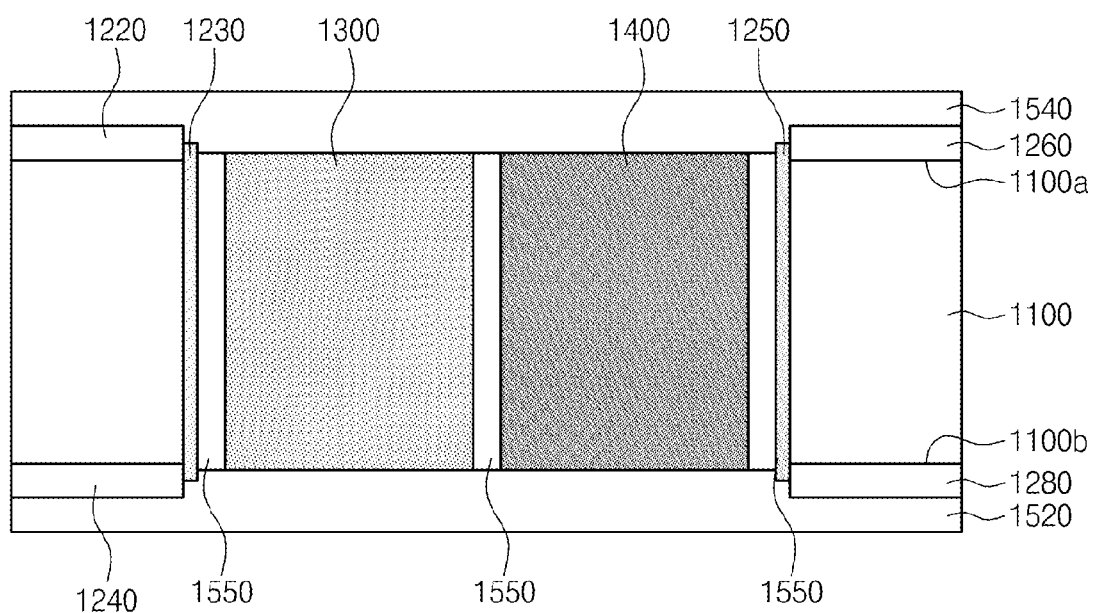

Referring to FIG. 6D, the vertical insulating layer 1550, the upper insulating layer 1540, and the lower insulating layer 1520 may be formed in the package substrate 30 of semiconductor package 2. The vertical insulating layer 1550 may be formed between the power block 1300 and the ground block 1400. The vertical insulating layer 1550 may be provided at substantially the same level as those of the power block 1300 and the ground block 1400. The upper insulating layer 1540 may be formed to cover top surfaces of the first plates 1220 and 1260, the power block 1300, and the ground block 1400. The lower insulating layer 1520 may be formed to cover bottom surfaces of the second plates 1240 and 1280, the power block 1300, and the ground block 1400.

Figure 6E:
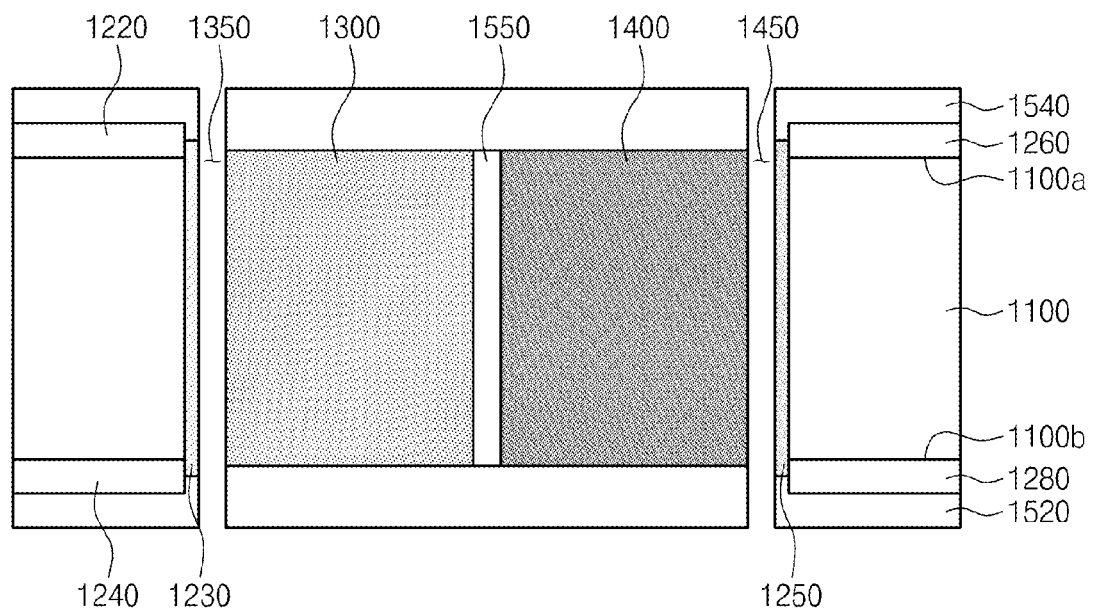

Referring to FIG. 6E, the laser drilling process may be performed to form metal via holes 1350 and 1450 between the power block 1300 and the core part 1100 and between the ground block 1400 and the core part 1100, respectively. The metal via holes 1350 and 1450 may be provided to penetrate the core part 1100, the upper insulating layer 1540, and the lower insulating layer 1520. The metal via holes 1350 and 1450 may be formed between the power block 1300 and the core part 1100 and between the ground block 1400 and the core part 1100. As a result of the formation of the metal via holes 1350 and 1450, the power block 1300, the ground block 1400, and the metal blocks 1230 and 1250 may be partially removed.

Figure 6F:
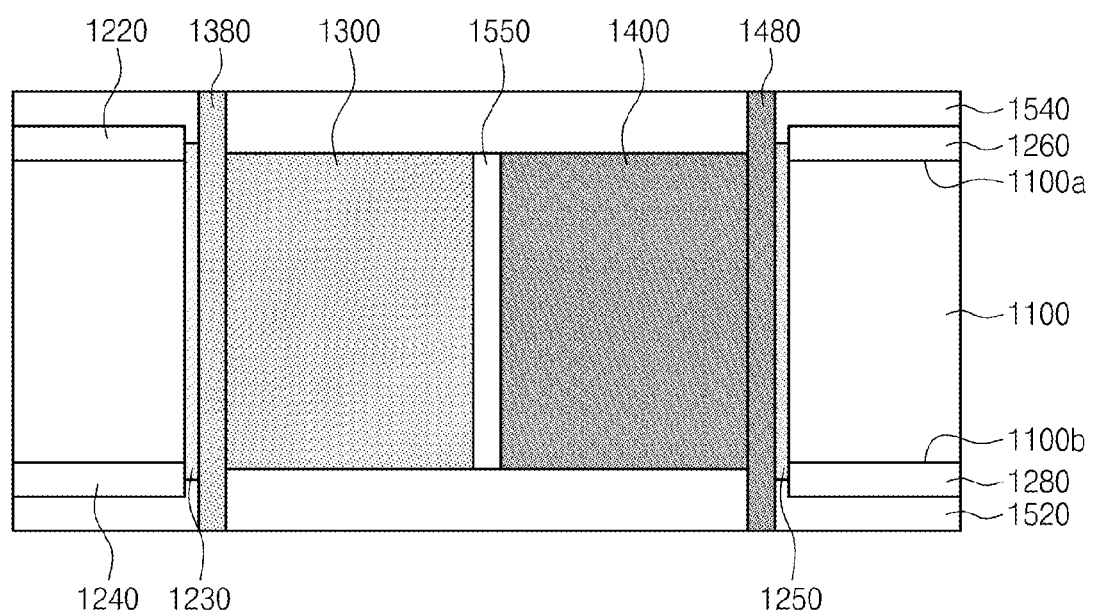

Referring to FIG. 6F, the metal vias 1380 and 1480 may be formed in the package substrate 30 of semiconductor package 2. For example, the formation of the metal vias 1380 and 1480 may include forming a conductive material (e.g., copper (Cu), tungsten (W), and/or aluminum (Al)) to fill the metal via holes 1350 and 1450. The metal vias 1380 and 1480 may include the first metal via 1380 in contact with the power block 1300 and the second metal via 1480 in contact with the ground block 1400. The first metal via 1380 may be provided between the first metal block 1230 and the power block 1300 to electrically connect the first power plate 1220 to the second power plate 1240. The first metal via 1380 may be in contact with a side surface of the power block 1300. The second metal via 1480 may be provided between the second metal block 1250 and the ground block 1400 to electrically connect the first ground plate 1260 to the second ground plate 1280. The second metal via 1480 may be in contact with a side surface of the ground block 1400.

Figure 6G:
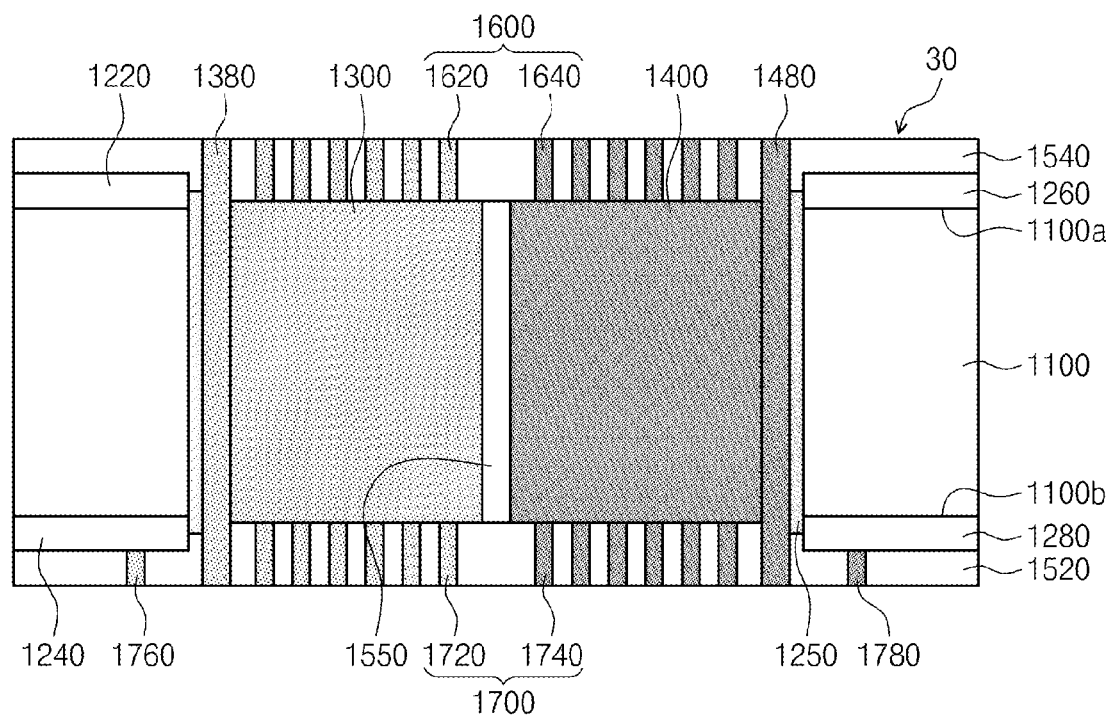

Referring to FIG. 6G, the plurality of first vias 1600 and the plurality of second vias 1700 may be formed in the upper insulating layer 1540 and the lower insulating layer 1520, respectively, of the package substrate 30. The laser drilling process and the deposition process may be performed to form the plurality of first vias 1600 penetrating the upper insulating layer 1540 and the plurality of second vias 1700 penetrating the lower insulating layer 1520. The plurality of first vias 1600 may be formed on the top surfaces of the power block 1300 and the ground block 1400. The plurality of first vias 1600 may connect each of the power block 1300 and the ground block 1400 to the semiconductor chip 40. The plurality of first vias 1600 may include the first power vias 1620 connected to the power block 1300 and the first ground vias 1640 connected to the ground block 1400.

The plurality of second vias 1700 may be formed on the bottom surfaces of the power block 1300 and the ground block 1400. The plurality of second vias 1700 may be extended toward the bottom surface 30b of the package substrate 30 of the semiconductor package 2. The plurality of second vias 1700 may include the second power vias 1720 connected to the power block 1300 and the second ground vias 1740 connected to the ground block 1400.

As a result of the afore-described series of processes, the package substrate 30 of semiconductor package 2, in which the power block 1300 and the ground block 1400 are embedded, may be manufactured.

Figure 6H:
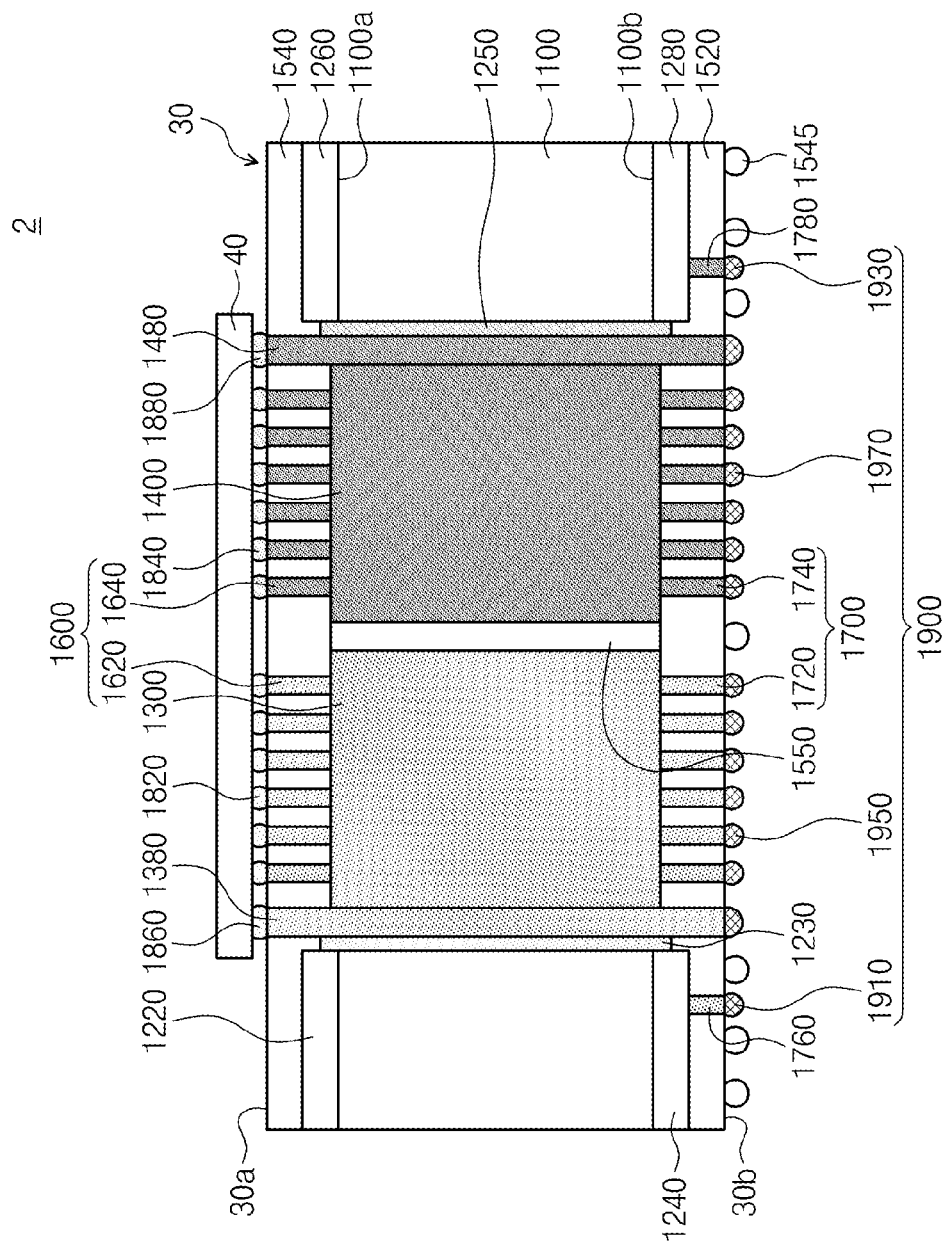

Referring to FIG. 6H, the semiconductor chip 40 may be mounted on the package substrate 30 of the semiconductor package 2. The solder balls 1820, 1840, 1860, and 1880 may be formed between the package substrate 30 and the semiconductor chip 40 mounted on the package substrate 30 of the semiconductor package 2 to connect the package substrate 30 to the semiconductor chip 40. The power solder balls 1820 may be formed to be in contact with the first power vias 1620 and the semiconductor chip 40. The power solder balls 1820 may be connected to the power block 1300 and the first power vias 1620 to supply the electric power to the semiconductor chip 40. The ground solder balls 1840 may be formed to be in contact with first ground vias 1640 and the semiconductor chip 40. The ground solder balls 1840 may be connected to the ground block 1400 and the first ground vias 1640 to serve as the ground terminal. The metal solder balls 1860 and 1880 may be formed to be in contact with the metal vias 1380 and 1480 and the semiconductor chip 40. The metal solder ball 1860 adjacent to the power block 1300 may be connected to the metal via 1380 to supply the electric power to the semiconductor chip 40. The metal solder ball 1880 adjacent to the ground block 1400 may be connected to the metal via 1480 to serve as the ground terminal.

The outer terminal 1545 and the connection terminals 1900 may be formed on the bottom surface 30b of the package substrate 30 of the semiconductor package 2. The connection terminals 1900 may include the first connection terminal 1910, the second connection terminal 1930, the third connection terminal 1950, and the fourth connection terminal 1970. The first connection terminal 1910 may be electrically connected to the third via 1760. The second connection terminal 1930 may be electrically connected to the fourth via 1780. The third connection terminal 1950 may be electrically connected to the second power via 1720 and the first metal via 1380. The fourth connection terminal 1970 may be electrically connected to the second ground via 1740 and the second metal via 1480. The first connection terminal 1910 and the third connection terminal 1950 may serve as the power terminal, and the second connection terminal 1930 and the fourth connection terminal 1970 may serve as the ground terminal.

Figure 7:
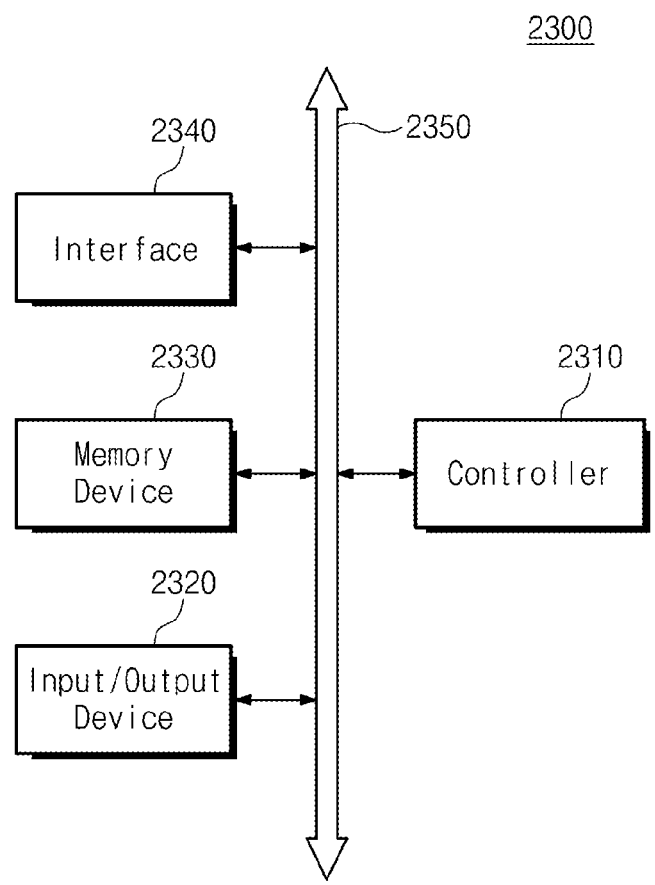
FIG. 7 is a block diagram schematically illustrating a memory system including a semiconductor package according to example embodiments of the inventive concepts.

FIG. 7 is a block diagram schematically illustrating an electronic system including a semiconductor package according to example embodiments of the inventive concepts.

The semiconductor package according to example embodiments of the inventive concepts may be applied to an electronic system. For example, the semiconductor package according to example embodiments of the inventive concepts may be provided in the form of a memory device.

Referring to FIG. 7, an electronic system 2300 may include a controller 2310, an input-output (I/O) device 2320, and a memory device 2330. The controller 2310, the I/O device 2320, and the memory device 2330 may be coupled to each other via a bus 2350. The bus 2350 may correspond to a path through which electrical signals are transmitted. The controller 2310 may include at least one of a microprocessor, a digital signal processor, a microcontroller or other logic device, which is configured to have a similar function to any one of the microprocessor, the digital signal processor and the microcontroller. The controller 2310 and the memory device 2330 may include one of the semiconductor packages according to example embodiments of the inventive concepts. The I/O device 2320 may include a keypad, a keyboard, and/or a display unit. The memory device 2330 may store data and/or commands executed by the controller 2310. The memory device 2330 may include a volatile memory device and/or a non-volatile memory device. For example, the memory device 2330 may include a FLASH memory device. For example, the FLASH memory device may be mounted in an information processing system such as a mobile device and/or a desktop computer. The flash memory device may constitute a solid state drive (SSD). Herein, the memory device 2330 may be configured to stably store a large capacity of data into the FLASH memory device. The electronic system 2300 may further include an interface unit 2340 for transmitting or receiving data to or from a communication network. The interface unit 2340 may be operated in a wireless or wired manner. For example, the interface unit 2340 may include an antenna for wireless communication or a transceiver for wireless or wired communication. Although not shown in the drawings, the electronic system 2300 may further include an application chipset and/or a camera image processor.

The electronic system 2300 may be realized as a mobile system, a personal computer, an industrial computer, and/or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 2300 performs wireless communication, the electronic system 2300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 8:
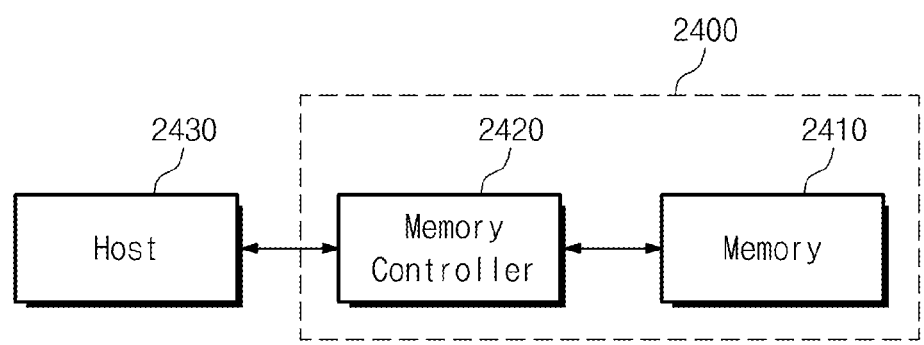
FIG. 8 is a block diagram schematically illustrating an electronic system including a semiconductor package according to example embodiments of the inventive concepts.

FIG. 8 is a block diagram schematically illustrating an electronic system including a semiconductor package according to example embodiments of the inventive concepts.

The semiconductor package according to example some embodiments of the inventive concepts may be provided in a form of a memory card.

Referring to FIG. 8, a memory card 2400 may include a non-volatile memory device 2410 and a memory controller 2420. The non-volatile memory device 2410 and the memory controller 2420 may store data or read stored data. The non-volatile memory device 2410 may include at least one non-volatile memory device, to which a semiconductor package technology according to example embodiments of the inventive concepts may apply. The memory controller 2420 may control the non-volatile memory device 2410 to read the stored data and/or to store data in response to read/write request of a host 2430.

According to example embodiments of the inventive concepts, a semiconductor package may be configured to have a reduced total inductance, and consequently to have improved electric characteristics.

According to example embodiments of the inventive concepts, the semiconductor package may be configured to have improved heat-dissipation characteristics.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
    a package substrate with a top surface and a bottom surface opposite to the top surface, the top surface of the package substrate configured to have a semiconductor chip mounted thereon;
    a power block and a ground block in the package substrate, the power block configured as a power pathway penetrating the package substrate, and the ground block configured as a ground pathway penetrating the package substrate;
    first vias extended from the power block and the ground block, the first vias electrically connected to the semiconductor chip;
    second vias extended from the power block and the ground block toward the bottom surface of the package substrate; and
    block vias penetrating the power and the ground block, the block vias electrically connected to the semiconductor chip and electrically separated from the power block and the ground block.

2. The semiconductor package of claim 1, wherein the block vias comprise:
    a ground via penetrating the power block such that the ground via is electrically separated from the power block; and
    a power via penetrating the ground block such that the power via is electrically separated from the ground block, wherein, the ground via is provided as the ground pathway penetrating the package substrate, and the power via is provided as the power pathway penetrating the package substrate.

3. The semiconductor package of claim 2, wherein
    the ground via is provided in plural at a central region of the power block, and
    the power via is provided in plural at a central region of the ground block.

4. The semiconductor package of claim 2, further comprising:
    a first connection terminal on the bottom surface of the package substrate, the first connection terminal electrically connected to the power via; and
    a second connection terminal on the bottom surface of the package substrate, the second connection terminal electrically connected to the ground via.

5. The semiconductor package of claim 1, wherein
    the first vias include,
        a first power via electrically connected to the power block, and
        a first ground via electrically connected to the ground block; and
    the second vias include,
        a second power via electrically connected to the power block, and
        a second ground via electrically connected to the ground block.

6. The semiconductor package of claim 5, further comprising:
    a solder ball connecting at least one of the first vias with the semiconductor chip, the solder ball including,
        a power solder ball connected to the first power via, and
        a ground solder ball connected to the first ground via.

7. The semiconductor package of claim 5, further comprising:
    a first connection terminal on the bottom surface of the package substrate, the first connection terminal electrically connected to the first power via;
    a second connection terminal on the bottom surface of the package substrate, the second connection terminal electrically connected to the first ground via;
    a third connection terminal electrically connected to the second power via; and
    a fourth connection terminal electrically connected to the second ground via.

8. The semiconductor package of claim 1, further comprising:

an insulating layer between the power block and the ground block, the insulating layer extended along sidewalls of the power block and the ground block.

9. A semiconductor package, comprising:
a package substrate including a core part, a first plate, and a second plate, the first plate and second plate on a respective one of top and bottom surfaces of the core part;
a semiconductor chip on a top surface of the package substrate;
a power block and a ground block in the package substrate, the power block configured as a power pathway penetrating the package substrate, and the ground block configured as a ground pathway penetrating the package substrate;
first vias electrically connecting the power block and the ground block to the semiconductor chip;
second vias extended from the power block and the ground block toward a bottom surface of the package substrate; and
metal vias connecting the first plate to the second plate, the metal vias in contact with at least one of the power block and the ground block.

10. The semiconductor package of claim 9, wherein the first plate includes,
a first power plate on the top surface of the core part and adjacent to the power block, and
a first ground plate on the top surface of the core part and adjacent to the ground block; and
the second plate includes
a second power plate on the bottom surface of the core part and adjacent to the power block, and
a second ground plate on the bottom surface of the core part and adjacent to the ground block.

11. The semiconductor package of claim 10, wherein the metal vias comprise:
a first metal via in contact with the power block, the first metal via electrically connecting the first power plate to the second power plate; and
a second metal via in contact with the ground block, the second metal via electrically connecting the first ground plate to the second ground plate.

12. The semiconductor package of claim 10, further comprising:
a metal block in contact with a side surface of the power block and the ground block, the metal block connecting the first plate to the second plate.

13. The semiconductor package of claim 12, wherein the metal block comprises:
a first metal block electrically connected to the power block such that the first metal block electrically connects the first power plate to the second power plate; and
a second metal block electrically connected to the ground block such that the second metal block electrically connects the first ground plate to the second ground plate.

14. The semiconductor package of claim 13, wherein the metal vias comprises:
a first metal via between the power block and the first metal block such that the first metal via electrically connects the first power plate to the second power plate; and
a second metal via between the ground block and the second metal block such that the second metal via electrically connects the first ground plate to the second ground plate.

15. The semiconductor package of claim 10, further comprising:
a third via extended from the second power plate toward the bottom surface of the package substrate; and
a fourth via extended from the second ground plate toward the bottom surface of the package substrate.

16. A package substrate configured to electrically connect to a semiconductor chip mounted on a first surface thereof, the package substrate comprising:
connection terminals on a second surface of the package substrate;
a power block configured to provide a plurality of first electrical paths between the connection terminals and the semiconductor chip; and
a ground block configured to provide a plurality of second electrical paths between the connection terminals and the semiconductor chip, the at least one of the power block and the ground block having block vias therein to electrically connect at least one of the connection terminals to the semiconductor chip while the block vias are electrically separate from the power block and the ground block, the block vias configured to provide at least one of a ground voltage and a source voltage to the semiconductor chip.

17. The package substrate of claim 16, further comprising:
a core part having a bottom surface and a top surface, the top surface and the bottom surface having a respective one of a first plate and a second plate thereon.

18. The package substrate of claim 16, further comprising:
a second insulating layer extended along a sidewall of the power block and a sidewall of the ground block to electrically insulate the power block and the ground block.

19. The package substrate of claim 18, wherein
the power block is adjacent to the ground block with the second insulating layer therebetween such that a mutual inductance exists between the power block and the ground block, and
at least one of the power block and the ground block is configured to dissipate heat generated by the semiconductor chip.

* * * * *